United States Patent
Ellis-Monaghan et al.

(10) Patent No.: US 7,538,373 B2
(45) Date of Patent: May 26, 2009

(54) BODY POTENTIAL IMAGER CELL

(75) Inventors: John J. Ellis-Monaghan, Grand Isle, VT (US); Mark D. Jaffe, Shelburne, VT (US); Alain Loiseau, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 11/765,485

(22) Filed: Jun. 20, 2007

(65) Prior Publication Data

US 2007/0235780 A1    Oct. 11, 2007

Related U.S. Application Data

(62) Division of application No. 10/906,625, filed on Feb. 28, 2005, now Pat. No. 7,276,748.

(51) Int. Cl.
*H01L 31/062* (2006.01)
*H01L 31/113* (2006.01)
*H01L 29/00* (2006.01)

(52) U.S. Cl. ............... 257/292; 257/291; 257/506; 257/E27.13; 257/E27.133

(58) Field of Classification Search .............. 257/191, 257/192, 234, E27.13, E27.133, 506; 250/208.1, 250/214.1, 214 SW; 348/307, 308, 294
See application file for complete search history.

(56) References Cited

U.S. PATENT DOCUMENTS

| | | | |
|---|---|---|---|
| 4,551,742 A * | 11/1985 | Takemoto et al. ........... 257/291 |
| 5,861,621 A * | 1/1999 | Takebe et al. ........... 250/214 R |
| 6,020,581 A | 2/2000 | Dennard et al. |
| 6,127,697 A | 10/2000 | Guidash |
| 6,297,070 B1 | 10/2001 | Lee et al. |
| 6,504,195 B2 | 1/2003 | Guidash |
| 6,927,433 B2 * | 8/2005 | Hynecek ...................... 257/292 |
| 2002/0121656 A1 | 9/2002 | Guidash |
| 2002/0140010 A1 | 10/2002 | Vu et al. |
| 2003/0062561 A1 | 4/2003 | Guidash |
| 2003/0205773 A1 | 11/2003 | Rhodes |
| 2003/0218116 A1 * | 11/2003 | Boer ........................ 250/208.1 |
| 2004/0135207 A1 * | 7/2004 | Dosluoglu et al. .......... 257/365 |
| 2005/0023580 A1 * | 2/2005 | Rhodes ........................ 257/292 |
| 2005/0161713 A1 * | 7/2005 | Rhodes ........................ 257/292 |
| 2006/0001059 A1 * | 1/2006 | Mouli et al. ................. 257/292 |

* cited by examiner

*Primary Examiner*—Shouxiang Hu
(74) *Attorney, Agent, or Firm*—Schmeiser, Olsen & Watts; Anthony J. Canale

(57) ABSTRACT

An imaging circuit, an imaging sensor, and a method of imaging. The imaging cell circuit including one or more imaging cell circuits, each imaging cell circuit comprising: a transistor having a floating body for holding charge generated in the floating body in response to exposure of the floating body to electromagnetic radiation; means for biasing the transistor wherein an output of the transistor is responsive to the electromagnetic radiation; and means for selectively connecting the floating body to a reset voltage supply.

6 Claims, 7 Drawing Sheets

BODY POTENTIAL IMAGER CELL

This application is a division of application Ser. No. 10/906,625 filed on Feb. 28, 2005, now U.S. Pat. No. 7,276,748.

FIELD OF THE INVENTION

The present invention relates to the field of solid-state imagers; more specifically, it relates to a body potential imaging cell and array.

BACKGROUND OF THE INVENTION

Imaging sensors are well known in the art. Imaging sensors are used in cameras and other detectors to provide an image of a scene or object for display or output purposes. Imaging sensors are operative over various sections of the electromagnetic spectrum and at various intensity levels. Imaging sensors operate by converting electromagnetic energy to charge. The charge is collected and is sensed by an output device. Typically, the charge is collected on a capacitor and the voltage of the capacitor is sensed. Devices using these imaging arrays have relatively slow shutter speeds, low contrast and high power consumption.

Therefore, there is a need for an imaging cell with improved sensitivity and performance.

SUMMARY OF THE INVENTION

The present invention describes an imaging cell, which uses a floating body of a transistor for charge collection. Upon exposure to incident electromagnetic radiation the body of the collection transistor charges up, the threshold voltage of the collection transistor decreases. The collection transistor is then used in a circuit whose output is dependent upon the threshold voltage of the collection transistor. A reset transistor is provided to discharge the floating body between exposures.

A first aspect of the present invention is an imaging circuit, comprising one or more imaging cell circuits, each imaging cell circuit comprising: a transistor having a floating body for holding charge generated in the floating body in response to exposure of the floating body to electromagnetic radiation; means for biasing the transistor wherein an output of the transistor is responsive to the electromagnetic radiation; and means for selectively connecting the floating body to a reset voltage supply.

A second aspect of the present invention is an imaging sensor, comprising: a first transistor having a source region, a drain region, a channel region and a gate; a second transistor having a floating body for holding charge generated in response to exposure of the floating body to electromagnetic radiation, a source region, a drain region and a gate; and the source, first channel and first drain regions of the first transistor connected in series between a reset voltage supply and the floating body of the second transistor.

A third aspect of the present invention is a method of imaging, comprising: forming a transistor having a floating body for holding charge generated in response to exposure of the floating body to electromagnetic radiation; biasing the transistor wherein an output of the transistor is responsive to the electromagnetic radiation; and selectively connecting the floating body to a reset voltage supply to store or discharge charge stored on the floating body.

A fourth aspect of the present invention is a method of forming an imaging sensor, comprising: forming a first transistor having a source region, a drain region, a channel region and a gate; forming a second transistor having a floating body for holding charge generated in response to exposure of the floating body to electromagnetic radiation, a source region, a drain region and a gate; and connecting the source, first channel and first drain regions of the first transistor in series between a reset voltage supply and the floating body of the second transistor.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 7A is a plan view and FIGS. 7B and 6C are a cross-sectional views through lines 7B-7B and 6C-6C respectively of FIG. 7A of a third embodiment of the detector section of an imaging cell according to the present invention.

DETAILED DESCRIPTION OF THE INVENTION

Figure 1:
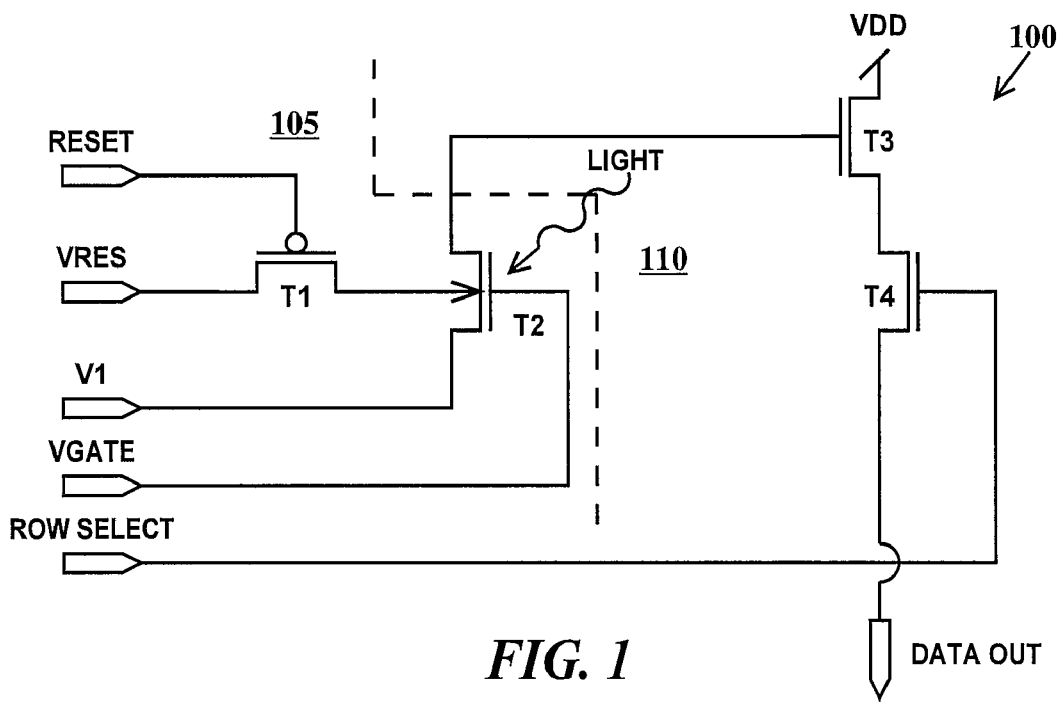
FIG. 1 is a circuit diagram of a first imaging cell circuit according to the present invention.

FIG. 1 is a circuit diagram of a first imaging cell circuit according to the present invention. In FIG. 1, an imaging cell circuit 100 includes a detector section 105 and a read out section 110. Detector section 105 includes a reset PFET T1 and a collection NFET T2. Read out section 110 includes NFETs T3 and T4. The drain of PFET T1 is connected to a VRES pin. The VRES pin is connected to a reset voltage supply. The reset voltage level may be ground or some other starting bias voltage for the well. The gate of PFET T1 is connected to a RESET pin, and the source of PFET T1 is connected to the body of NFET T2. The drain of NFET T2 is connected to a V1 pin, the gate of NFET T2 is connected to a VGATE pin and the source of NFET T2 is connected to the gate of NFET T3. NFET T3 is a source follower. The drain of NFET T3 is connected to a voltage source VDD and the source of NFET T3 is connected to the drain of NFET T4. The gate of NFET T4 is connected to a ROW SELECT pin and the source of NFET T4 is connected to a DATA OUT pin.

There are three phases of operation of imaging cell circuit 100. In a first, or reset phase, a voltage level on pin V1 is set to ground, a voltage on the RESET pin is set to ground, turning on PFET T1 and pulling the body of NFET T2 to VRES, a voltage on the VGATE pin is set to VDD and a voltage on the ROW SELECT pin is set to ground, turning off NFET T4. Unless otherwise specified, ground indicates a voltage of zero volts. NFET T3 is off with the voltage applied to the gate of T3 being about 0 volts.

In a second, or incident radiation gathering phase, the voltage on the RESET pin is set to VDD turning off PFET T1 and isolating the body of NFET T2. The voltage on pin V1 remains at ground, the voltage on the VGATE pin is set to about 0 to about VDD/2 with NFET T2 lightly off and the voltage on the ROW SELECT pin remains at ground. With no incident radiation impinging on NFET T2, the body of NFET T2 remains at reset voltage supply. With incident radiation impinging on the body of NFET T2, charge is collected in the body of NFET T2, which changes the voltage potential between the body and gate of NFET T2. This causes the threshold voltage $V_T$ of NFET T2 to change. An example of incident electromagnetic radiation is light and particularly visible light. The more negative the body voltage on NFET T2, the higher the $V_T$ of NFET T2. After a predetermined period of time (the "shutter" time), the third phase is commenced.

In the third, or read phase, the voltage on the RESET pin remains at VDD, the voltage on the V1 pin is changed to a voltage between VDD and VGATE−Vtmax of transistor T2 (selected to maximize the effect of body voltage on the $V_T$ of NFET T2), the voltage level on the VGATE pin is set to VDD (or a lower voltage such that VGATE−Vtmax of transistor T2 is greater than the Vt of transistor T3) and the voltage on the ROW SELECT pin is set to VDD, turning on NFET T4. The transfer characteristic between NFET T2 and NFET T3 is the ratio of the swing between ground and VDD through NFET T3 and the change in $V_T$ generated by incident radiation collection in NFET T2. The output signal on a DATA OUT pin is a voltage which is dependent upon the amount of radiation, which was converted, to charge and collected in the body of NFET T2. This voltage can be converted to a digital signal by an analog to digital converter.

In imaging cell circuit 100, the physical connection between the drain of PFET T1 and the body of NFET T2 is a direct silicon-to-silicon connection as described infra. In an alternative circuit, PFET T1 is replaced with an NFET, in which case the polarity of the voltages applied to the RESET pin are reversed and the physical connection between the drain of now NFET T1 and the body of NFET T2 is a silicon to wire to silicon connection.

Figure 2:
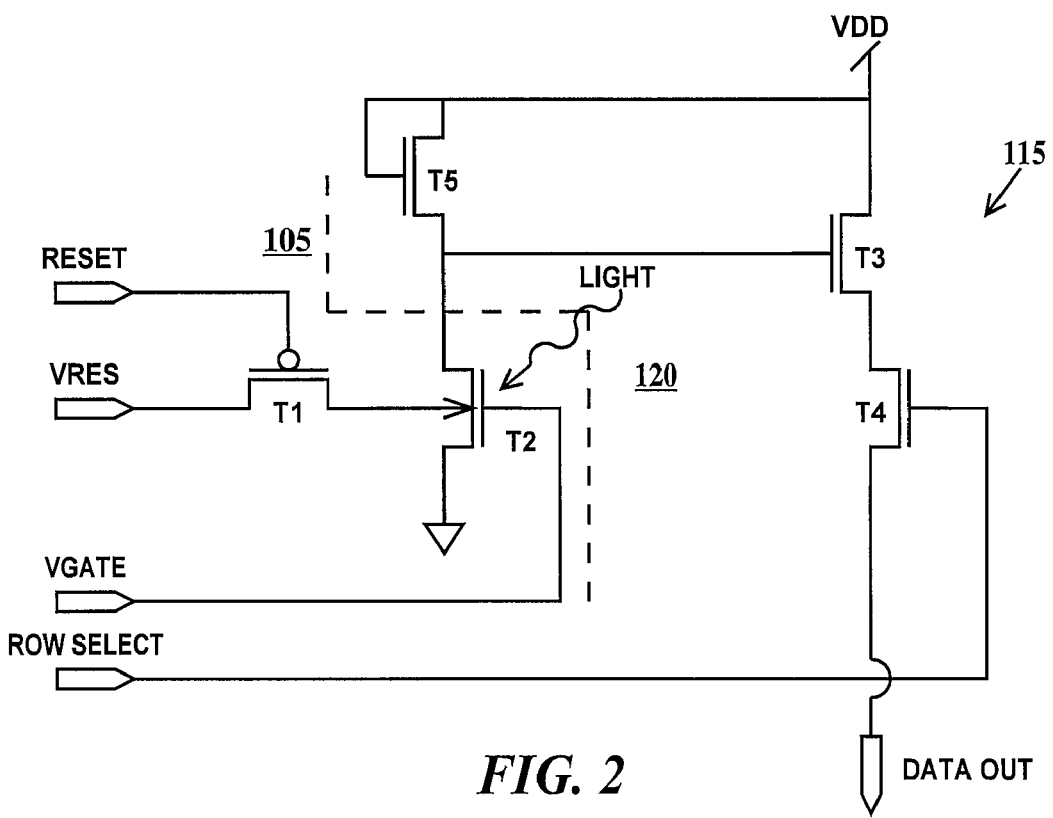
FIG. 2 is a circuit diagram of a second imaging cell circuit according to the present invention.

FIG. 2 is a circuit diagram of a second imaging cell circuit according to the present invention. In FIG. 2, an imaging cell circuit 115 is similar to imaging cell circuit 100 of FIG. 1 except that a read out stage 120 includes an NFET T5 acting as a resistor between VDD and source of NFET T2, the gate and drain of NFET T5 connected to VDD and the source of NFET T5 connected to the source of NFET T2. Operation of imaging cell circuit is the same as for imaging cell circuit 100 of FIG. 1 with the exception that the drain of NFET T2 is always at ground.

Figure 3:
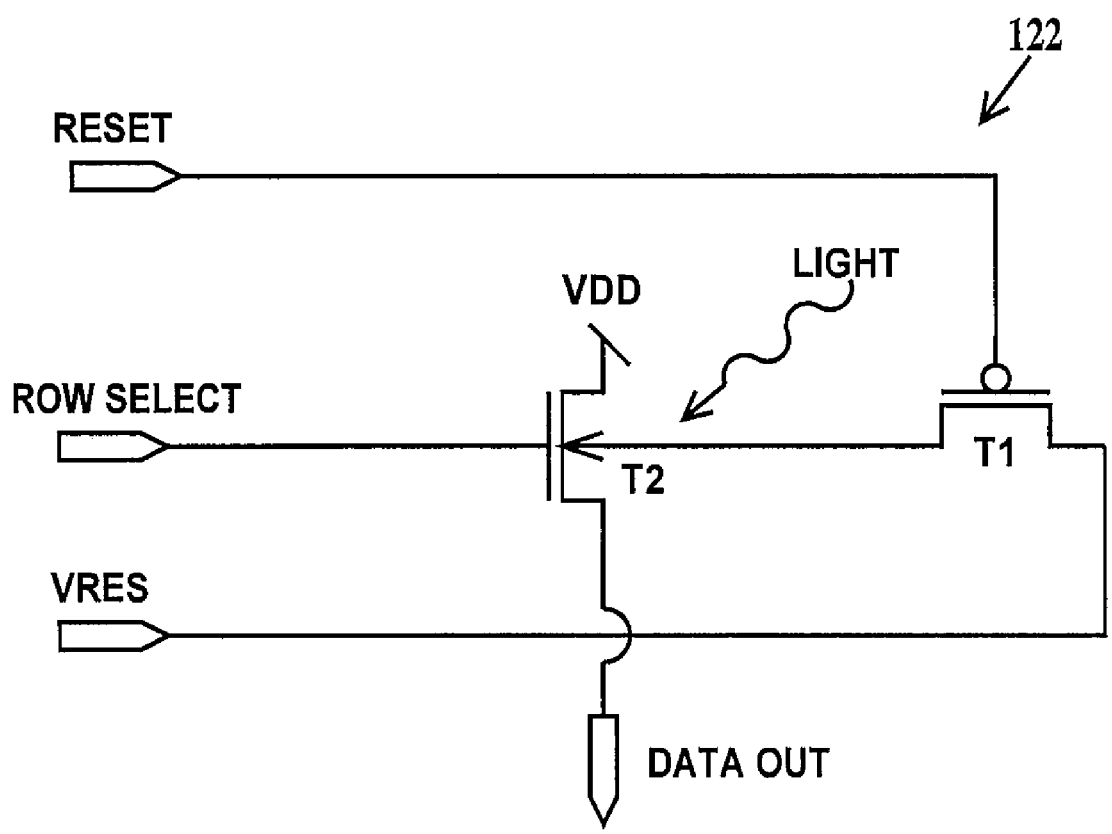
FIG. 3 is a circuit diagram of a third imaging cell circuit according to the present invention.

FIG. 3 is a circuit diagram of a third imaging cell circuit according to the present invention In addition, the body potential imager can be formulated in a 2-transistor form factor. In FIG. 3, and imaging cell 122 includes PFET T1 and NFET T2. The gate of PFET T1 is connected to the RESET pin, the drain of PFET T1 is connected to the VRES pin and the source of PFET T1 is connected the body of NFET T2. The gate of NFET T2 is connected to the ROW SELECT pin, the drain of NFET T2 is connected to VDD, the source of NFET T2 is connected to the DATA OUT pin.

There are three phases of operation of imaging cell 122. In a first or reset phase, NFET T1 is turned on setting by a voltage level on the RESET pin to ground and, a voltage on the ROW SELECT pin is set to ground. Then NFET T2 is turned off.

In a second or incident radiation gathering phase, with incident radiation impinging on NFET T2 charge accumulates in the body of NFET T2. PFET T1 is turned off and NFET T2 may be turned off or turned on if it is desirable to poll the value of the charged body of NFET T2 during illumination.

In a third or read phase, NFET T2 is turned on and the body of NFET T2 will source a current on the DATA OUT pin which is dependent upon the body bias induced on the gate of NFET T2 by the quantity of stored carriers in the body of NFET T2. This may then be amplified or directly converted to a voltage as application needs dictate.

Figure 4A:
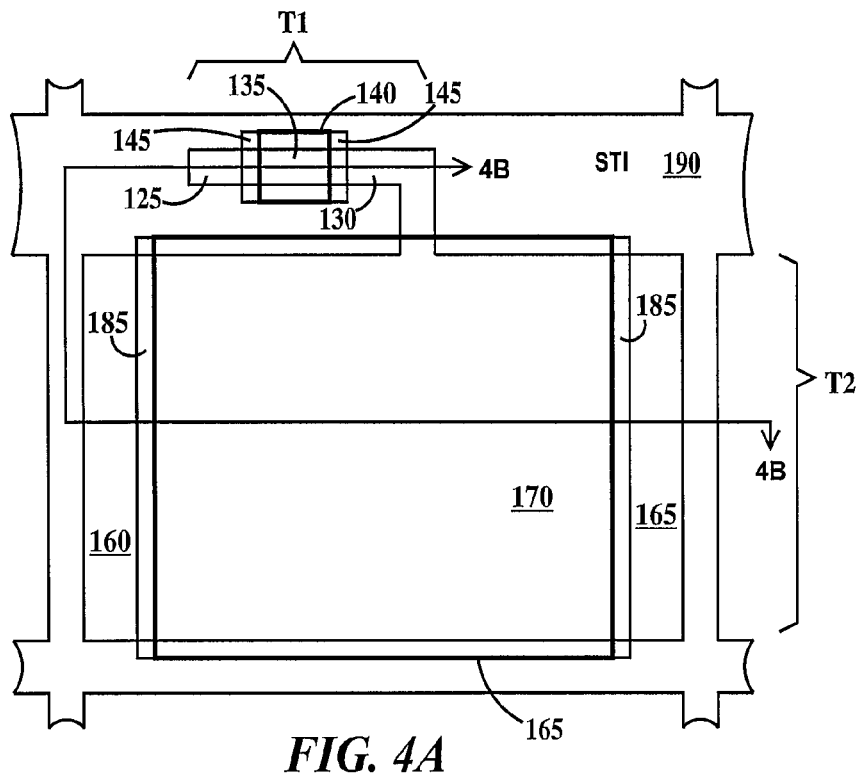
FIG. 4A is a plan view and FIG. 4B is a cross-sectional view through line 4B-4B of a first embodiment of the detector section of an imaging cell according to the present invention.
Figure 4B:
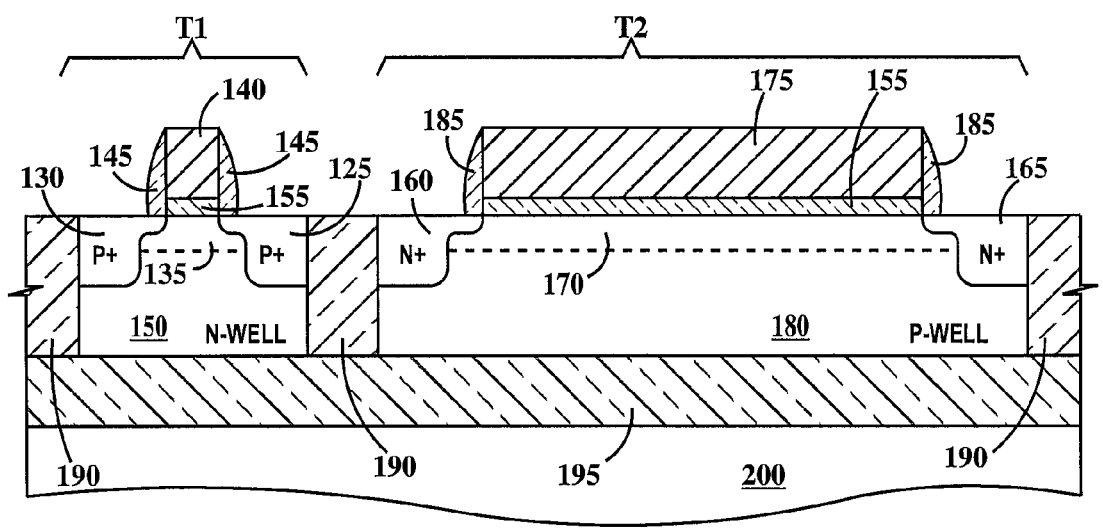

FIG. 4A is a plan view and FIG. 4B is a cross-sectional view through line 4B-4B of a first embodiment of the detector section of an imaging cell according to the present invention. In the first embodiment of the present invention, imaging cell circuit 100 of FIG. 1, 115 of FIG. 2 or 122 of FIG. 3 is fabricated in a silicon-on-insulator (SOI) substrate. In FIG. 4A and 4B, PFET T1 includes a P type drain region 125, a P type source region 130, an N type channel region 135 between the source and drain regions, and a gate 140 formed over the channel region. Drain region 125, source region 130 and channel region 135 are formed in an N-well 150. Spacers 145 are formed on the source/drain sides of gate 140. A gate dielectric 155 is formed under gate 140.

NFET T2 includes, a N type drain region 160, an N type source region 165, a P type channel region 170 between the source and drain regions, and a gate 175 formed over the channel region. Drain region 160, source region 165 and channel region 170 are formed in a P-well 180. P-well 180 is the body of NFET T2. Spacers 185 are formed on the source/drain sides of gate 175. Gate dielectric 155 is formed under gate 175.

Shallow trench isolation (STI) 190 and a buried oxide layer (BOX) 195, which physically contacts the STI, form the isolation for the elements of the pixel. Source region 130 (or an extension of source region 130) physically contacts P-well 180. BOX 195 is formed on a silicon substrate 200. Thus body of NFET T2 is electrically isolated except for a connection to source region 130 and floats when PFET T1 is turned off. Incident radiation striking P-well 180 through gate 175 creates electron/hole charge pairs in P-well 180. Gate 175 needs to be relatively transparent to incident radiation. In one example gate 175 is polysilicon about 500 Å to about 1500 Å thick.

It can be readily seen, that if PFET T1 is replaced with an NFET, P type source region 130 becomes an N type drain region and that the N type drain region and P-well 180 cannot be physically connected as a PN diode would result. Thus a connection using, for example, a metal wire, needs to be made between the N type drain region and P-well 180.

Figure 5A:
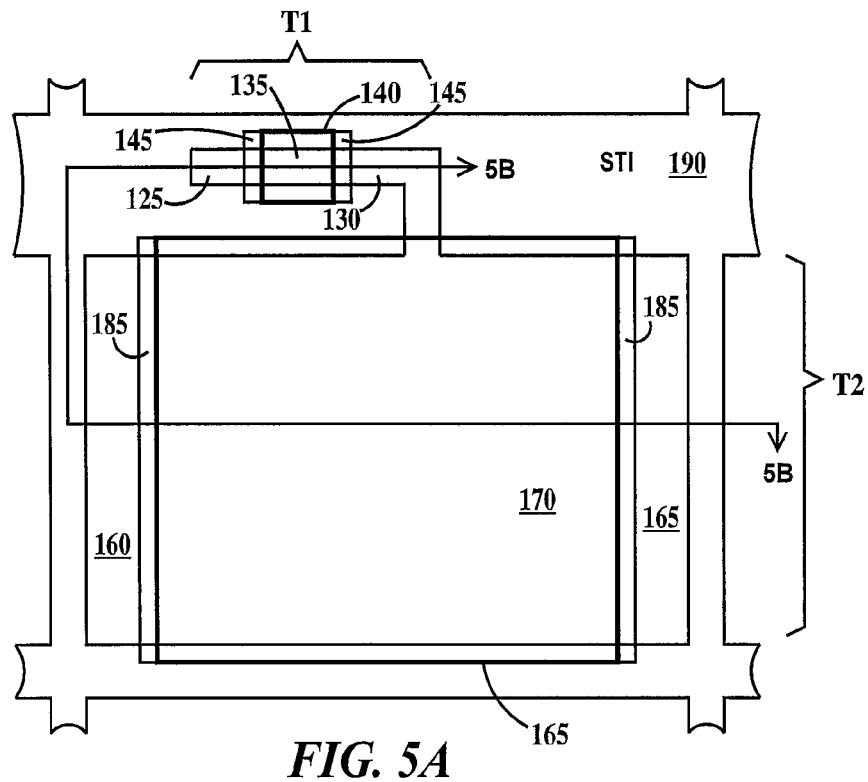
FIG. 5A is a plan view and FIG. 5B is a cross-sectional view through line 5B-5B of a second embodiment of the detector section of an imaging cell according to the present invention.
Figure 5B:
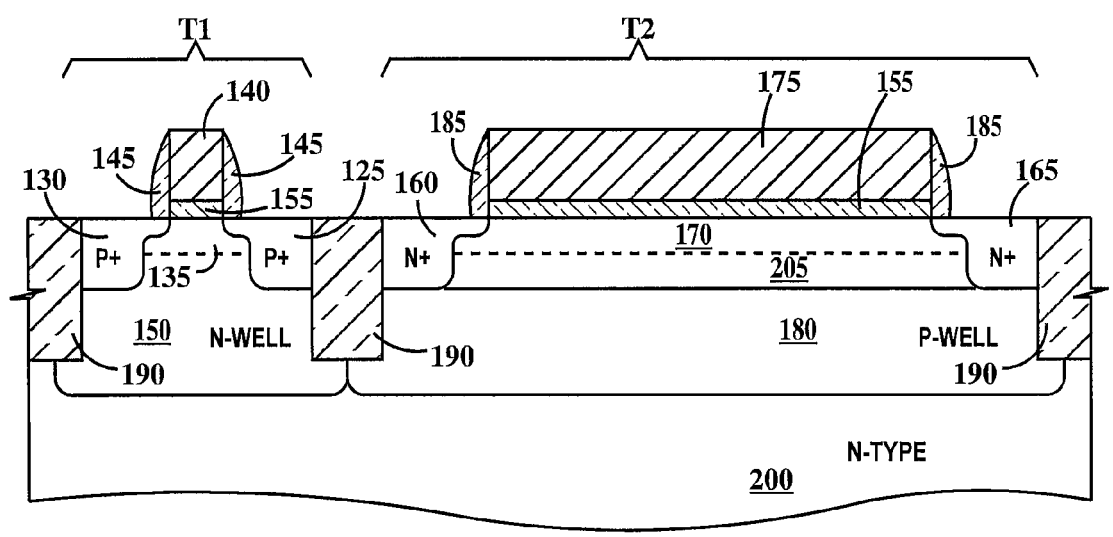

FIG. 5A is a plan view and FIG. 5B is a cross-sectional view through line 5B-5B of a second embodiment of the detector section of an imaging cell according to the present invention. In the second embodiment of the present invention, imaging cell circuit 100 of FIG. 1, 115 of FIG. 2 or 122 of FIG. 3 is fabricated in a bulk silicon substrate. The only differences between FIGS. 5A and 5B and FIGS. 4A and 4B, is BOX 195 is not present in FIGS. 5A and 5B, N-well 150 and P-well 180 extend under STI 190, substrate 200 is N-type and P-well 180 may be doped to a different concentration than an optional P-type region 205 that may be formed between drain 160 and source 165. In one example, P-well 180 may be more heavily doped P-type in order to provide robust electrical isolation and P-type region 205 more lightly P-doped than P-well 180.

Figure 6A:
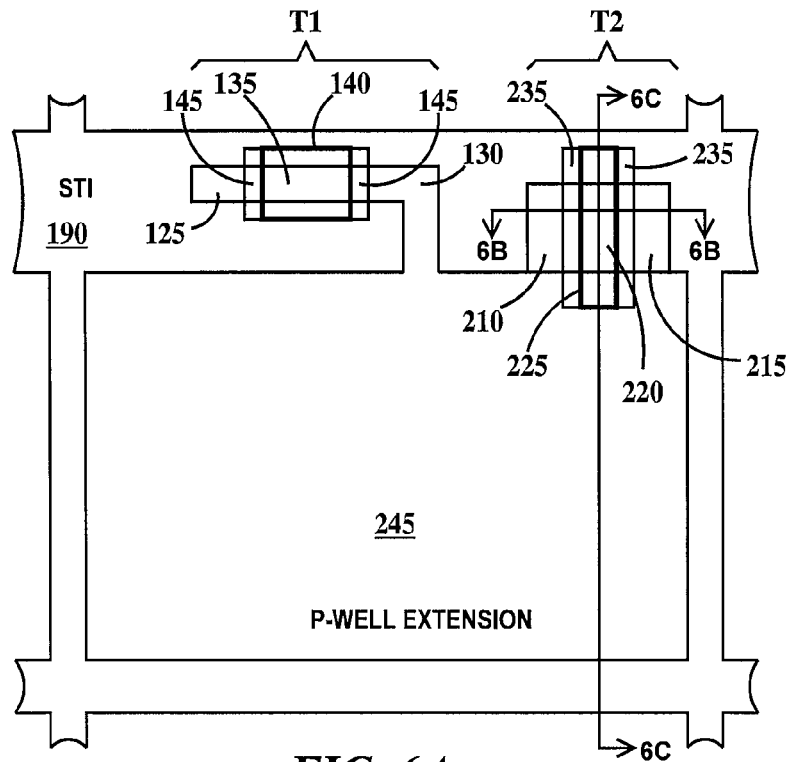
FIG. 6A is a plan view and FIGS. 6B and 6C are a cross-sectional views through lines 6B-6B and 6C-6C respectively of FIG. 6A of a third embodiment of the detector section of an imaging cell according to the present invention.
Figure 6B:
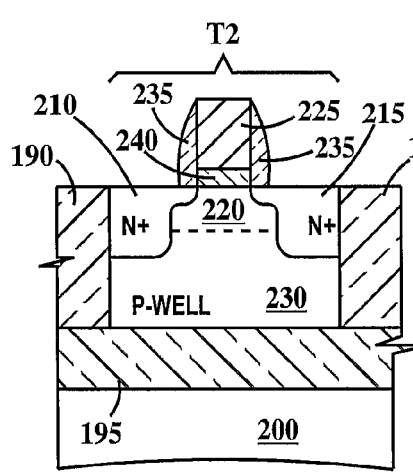
Figure 6C:
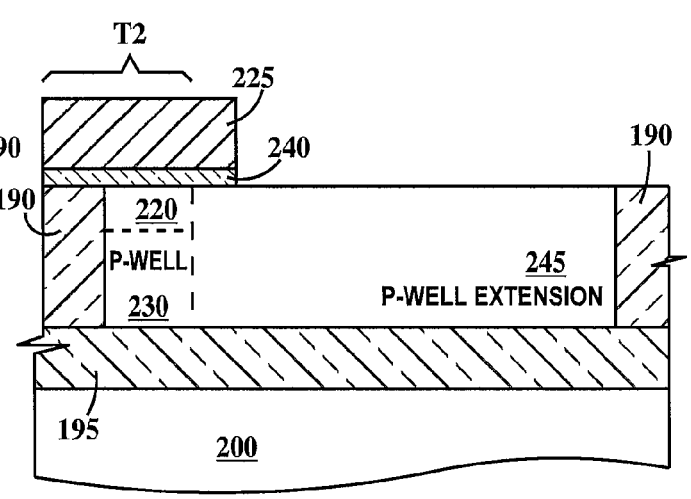

FIG. 6A is a plan view and FIGS. 6B and 6C are cross-sectional views through lines 6B-6B and 6C-6C respectively of FIG. 6A of a third embodiment of the detector section of an imaging cell according to the present invention. In the third embodiment of the present invention, imaging cell circuit 100 of FIG. 1, 115 of FIG. 2 or of 122 of FIG. 3 is fabricated in a silicon-on-insulator (SOI) substrate. In FIG. 6A, 6B and 6C, PFET T1 includes, P type drain region 125, P type source region 130, N type channel region 135 between the source and drain regions, and gate 140 formed over the channel region. Drain region 125, source region 130 and channel region 135 are formed in an N-well (not shown). Spacers 145 are formed on the source/drain sides of gate 140. A gate dielectric (not shown) is formed under gate 140.

NFET T2 includes, a N type drain region 210, an N type source region 215, a P type channel region 220 between the source and drain regions, and a gate 225 formed over the channel region. Drain region 210, source region 215 and channel region 220 are formed in a P-well 230. P-well 230 is the body of NFET T2. Spacers 235 are formed on the source/drain sides of gate 225. A gate dielectric 240 is formed under gate 225. A P-well extension 245 is contiguous and integral with P-well 230. While gate 225 is illustrated as overlapping P-well extension 245, gate 225 may be aligned so as not to overlap the P-well extension. P-well extension 245 acts as an extension of the body of NFET T2.

P-well 230 and P-well extension 245 are bounded by STI 190 and a BOX 195, which physically contacts the STI. Source region 130 physically contacts P-well extension 245. Thus the body of NFET T2 is electrically isolated except for a connection to source region 130 and floats when PFET T1 is turned off. Incident radiation striking P-well 230 through gate 225 and striking P-well extension 245 creates electron/hole charge pairs in P-well 230 and P-well extension 245. Most of the charge pairs are generated in P-well extension 245 because the P-well extension is generally many times larger in area than P-well 230. In one example, the area of P-well extension 245 is about 10 times or greater than the area of P-well 230.

Optionally, source 210 and/or drain 215 may extend into P-well extension 245 in order to reduce the dark current and speedup the collection of electrons and holes.

While a physical connection through silicon between P-well 230 and P-well extension 245 is illustrated in FIGS. 6A, 6B and 6C, the P-well extension may be physically isolated from but electrically connected to the P-well of NFET T2 by, for example, a metal wire.

As described supra, PFET T1 can be replaced with an NFET.

Figure 7A:
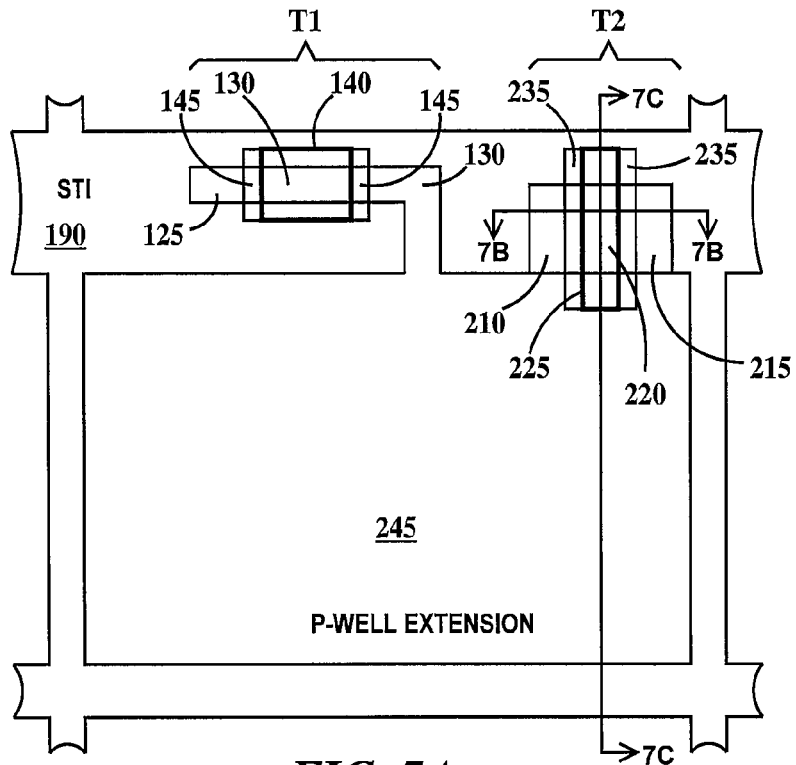
Figures 7B, 7C:
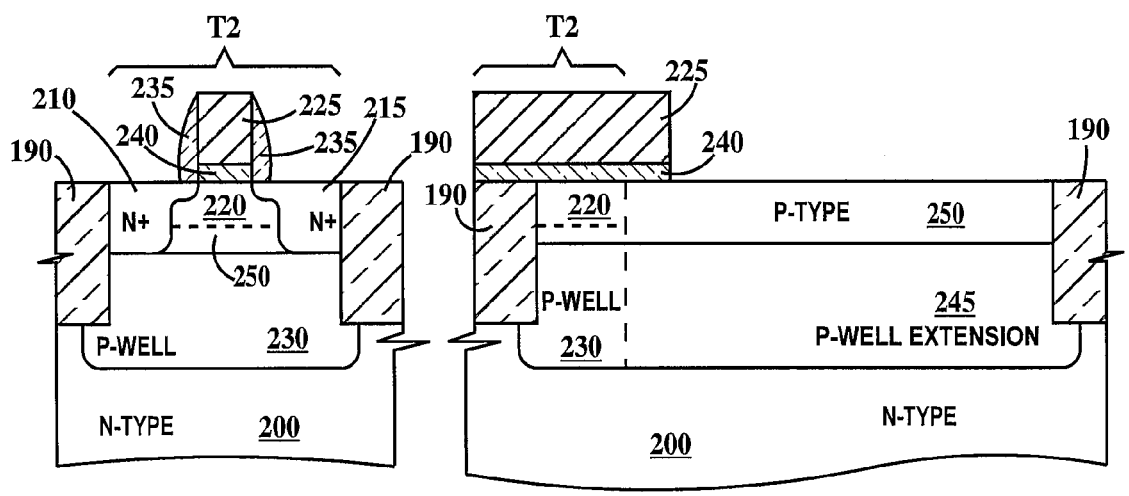

FIG. 7A is a plan view and FIGS. 7B and 6C are a cross-sectional views through lines 7B-7B and 7C-7C respectively of FIG. 7A of a third embodiment of the detector section of an imaging cell according to the present invention. In the fourth embodiment of the present invention, imaging cell circuit 100 of FIG. 1, 115 of FIG. 2 or 122 of FIG. 3 is fabricated in a bulk silicon substrate. The only differences between FIGS. 7A, 7B and 7C and FIGS. 6A and 6B is BOX 195 is not present in FIGS. 7A, 7B and 7C, P-well 230 and P-well extension 245 extend under STI 190, substrate 200 is N-type and P-well extension 245 or both P-well extension 245 and P-well 230 may be doped to a different concentration than an optional P-type region 250 formed between drain 210 and source 230 in P-well 230 and formed in P-well extension 245. In one example, P-well 230 and P-well extension 245 may be more heavily doped P-type in order to provide robust electrical isolation and doped P-type region 250 more lightly P-doped than the P-well or P-well extension.

Figure 8:
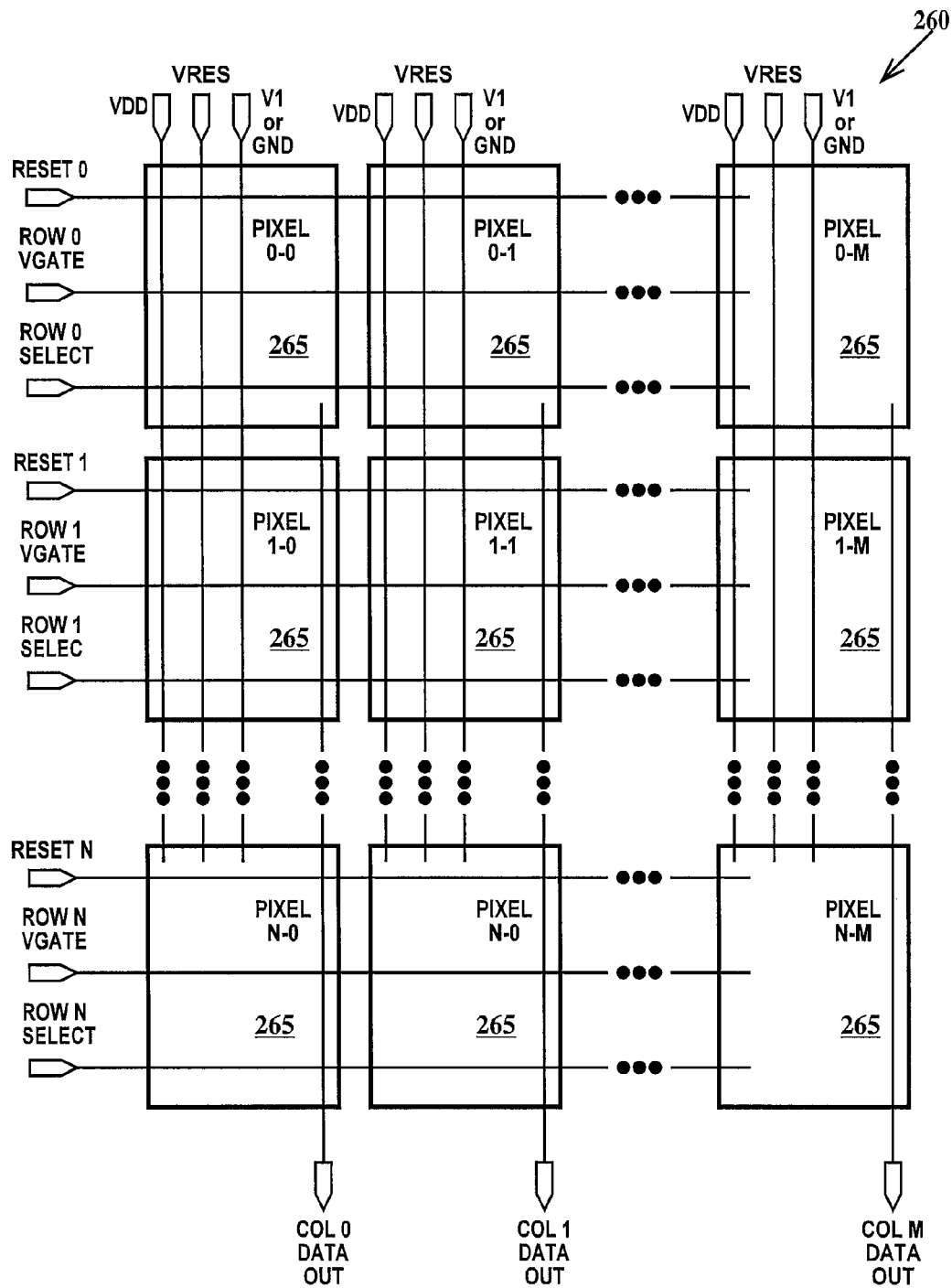
FIG. 8 is an exemplary imaging array utilizing imaging cells of the present invention.

FIG. 8 is an exemplary imaging array utilizing imaging cells of the present invention. In FIG. 8, an imaging array 260 includes an array of pixels 265 arranged in rows and columns. Pixels 265 comprise either imaging cell circuits 100 (see FIG. 1) or 115 (see FIG. 2). Pixels 265 comprise one of the embodiments of the present invention as illustrated in FIGS. 4A and 4B, 5A and 5B, 6A, 6B and 6C, or 7A, 7B and 7C as described infra. There are N+1 rows 0 through N and M+1 columns 0 through M columns. A RESET X, ROW X SELECT and VGATE X signal bus is coupled to each pixel in row X (where X is a whole positive integer between 0 and N). RESET X, ROW X SELECT and VGATE X signal buses are generally driven from a row decoder circuit (not shown). A VDD, VRES and V1 or GND power source is coupled to each pixel 265.

A COL Y DATA OUT signal bus is coupled to each pixel in column Y (where Y is a whole positive integer between 0 and M). Generally each COL Y DATA OUT signal bus is connected to a current amplified analog to digital converter.

Thus, the present invention provides an imaging cell with improved sensitivity and performance.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the semiconductor material silicon may be replaced with other semiconductor materials.

Therefore, it is intended that the following claims cover all such modifications and changes as fall within the true spirit and scope of the invention.

What is claimed is:

1. An imaging sensor, comprising:
    a first transistor having a source region, a drain region, a channel region and a gate;
    a second transistor having a floating body for holding charge generated in response to exposure of said floating body to electromagnetic radiation, said source region, said drain region and said channel region of said first transistor connected in series between a reset voltage supply and said floating body of said second transistor;
    a third transistor having a gate connected to a drain of said second transistor, a drain connected to an output voltage supply and a source connected to a drain of a fourth transistor, a source of said fourth transistor connected to an output of said imaging cell circuit and a gate of said fourth transistor connected to row select input of said imaging cell;
    a fifth transistor having a gate and a drain connected to said output voltage supply and a source connected to said gate of said third transistor and said drain of said second transistor; and
    a dielectric isolation abutting all sidewalls of said floating body of said second transistor except for a region of said sidewalls abutting said source region of said first transistor, a bottom surface of said floating body abutting a PN junction.

2. The imaging circuit of claim 1, wherein said electromagnetic radiation is light.

3. The imaging circuit of claim 1, wherein said electromagnetic radiation is light in the visible portion of the electromagnetic spectrum.

4. The imaging circuit of claim 1, wherein said second transistor is a complementary metal-oxide-semiconductor transistor.

5. The imaging circuit of claim 1, wherein said second transistor is an N-channel complementary metal-oxide-semiconductor transistor.

6. The imaging circuit of claim 1, wherein:
said floating body is a P-well;
a source region, said drain and a channel region of said second transistor are formed in said P-well; and
a gate is formed over said channel region.

* * * * *